United States Patent
Tang et al.

(10) Patent No.: US 9,274,158 B2
(45) Date of Patent: Mar. 1, 2016

(54) HYBRID/ELECTRICAL VEHICLE HV AC SYSTEM LEAKAGE AND GROUND FAULT DETECTION

(71) Applicant: Ford Global Technologies, LLC, Dearborn, MI (US)

(72) Inventors: Yuqing Tang, Northville, MI (US); Hongjie Wu, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 477 days.

(21) Appl. No.: 13/678,222

(22) Filed: Nov. 15, 2012

(65) Prior Publication Data

US 2014/0132278 A1 May 15, 2014

(51) Int. Cl.
*G01R 31/14* (2006.01)
*G01R 31/02* (2006.01)
*G01R 31/00* (2006.01)

(52) U.S. Cl.
CPC ............ *G01R 31/007* (2013.01); *G01R 31/025* (2013.01)

(58) Field of Classification Search
CPC ............................ G01R 31/007; G01R 31/025
USPC .................................. 324/500, 509, 510, 537
See application file for complete search history.

(56) References Cited

U.S. PATENT DOCUMENTS

| 5,382,946 | A | 1/1995 | Gale |
| 6,856,137 | B2 | 2/2005 | Roden et al. |
| 2005/0259370 | A1 | 11/2005 | Kubo |
| 2008/0278174 | A1 | 11/2008 | Li et al. |
| 2009/0184717 | A1 | 7/2009 | Ivan et al. |
| 2009/0184718 | A1 | 7/2009 | Ivan et al. |
| 2010/0244760 | A1* | 9/2010 | Anwar et al. ................. 318/490 |
| 2011/0175619 | A1* | 7/2011 | Bauer et al. ................... 324/510 |
| 2012/0038214 | A1* | 2/2012 | King et al. ....................... 307/77 |
| 2012/0112757 | A1* | 5/2012 | Vrankovic ........... G01R 31/025 324/509 |

* cited by examiner

*Primary Examiner* — Melissa Koval
*Assistant Examiner* — Farhana Hoque
(74) *Attorney, Agent, or Firm* — Maristyn Law LLC; Lynda F. Kouroupis; David B. Kelley

(57) ABSTRACT

Apparatus and methods for detection of a ground fault on a DC side as well as on an AC side of an inverter are presented. A detection means can receive forward and reverse current and provide an induced current based on the difference between them. A parameter associated with the induced current, or a parameter associated with a voltage generated by conduction of the induced current through a device, can be used to detect a ground fault. In addition, a detection means can be configured to receive transient current, and a resulting voltage at the detection means can be used for fault detection. A detection means can be disposed at the DC side of an inverter or at the AC side of the inverter. Apparatus and methods can be configured to detect AC leakage current caused by a ground fault.

8 Claims, 8 Drawing Sheets

HYBRID/ELECTRICAL VEHICLE HV AC SYSTEM LEAKAGE AND GROUND FAULT DETECTION

FIELD OF INVENTION

This invention relates generally to fault detection at electrified vehicles, and more particularly to detection of high voltage alternating current system leakage.

BACKGROUND OF INVENTION

Electric and hybrid electric vehicles employ a high voltage (HV) energy storage device (ESD), such as a high voltage traction battery, and a power conversion system to provide an alternating current (AC) output to a motor. With an adequately high voltage, the HV ESD can provide power to assist in motoring operations of the vehicle, thereby reducing its dependence on a fossil-fueled internal combustion engine. Because it is designed to provide motoring power, an HV ESD can have a considerably higher voltage than a standard auxiliary vehicle battery used to power low voltage vehicle systems. As a result, an HV ESD and its positive and negative rails are typically isolated from the vehicle's low voltage systems. Furthermore, as a precautionary measure, an HV ESD, unlike the auxiliary battery, is usually not grounded to a vehicle chassis, but is instead typically configured in an isolated return circuit. Despite best efforts to isolate the HV ESD and the HV AC system, on occasion, electric current may flow through an unintended path. For example, a short circuit or low impedance connection, i.e. a ground fault, may occur between an AC motor current and a chassis. If so, vehicle equipment coupled to the high voltage buses may experience extreme swings in voltage and current, and may even be significantly damaged.

In the past, various methods and systems have been proposed to detect faults in a vehicle's electrical system. For example, U.S. Pat. No. 5,382,946 issued to Gale (hereinafter "Gale"), teaches a method and a circuit for measuring the leakage path resistance in an electric vehicle having an isolated high voltage traction battery and an auxiliary battery grounded to the vehicle. The circuit operates by periodically applying a selected excitation signal and comparing the voltage induced on an energy storage element by the excitation signal to a selected reference voltage during a selected time period. An alternative embodiment provides a circuit that operates by applying a periodic excitation signal and comparing the phase shift of the voltage induced on an energy storage element to the phase shift of a signal derived from the excitation signal. While fit for their intended purposes, the solutions suggested by Gale are directed primarily towards detecting leakage between a traction battery and an auxiliary battery grounded to the vehicle. Leakage from a vehicle's AC system, such as leakage at the output of an inverter to a chassis is not addressed.

In contrast to Gale, other proposals have considered AC current leakage. For example, U.S. Pat. No. 6,856,137, issued to Roden et al. (hereinafter "Roden"), suggests an AC ground fault detector system that senses an AC signal indicative of an unintended electrical path between a load driven by a power source and a reference potential using a capacitively coupled circuit. A first power conductor is coupled to a first terminal of the power source and a second power conductor is coupled to a second terminal of the power source. A switching mechanism coupled to the first and second power conductors is operative for alternately connecting a phase of the load with the first and second power conductors according to a predetermined switching rate, whereby, during normal operation, voltages developed at the first power conductor and second power conductor are substantially constant with respect to a reference potential. In the event of an occurrence of the unintended electrical path of at least one phase of the load with the reference potential, time varying voltages are developed at the first power conductor and second power conductor associated with the switching rate. A fault detector senses presence of a square wave voltage caused by the fault through a series capacitive/resistive circuit. Roden also teaches that high voltage isolation can be performed through a sense capacitor or transformer while sensing the voltage change indicative of the ground fault condition. Roden thus teaches detection of a time-varying voltage on a DC bus to detect a ground fault.

U.S. Pat. No. 7,443,643 issued to Kubo (hereinafter "Kubo"), teaches an inverter device that comprises a ground fault detection circuit connected between a negative line of the battery and the vehicle body, and a controller, wherein the ground fault detection circuit includes a serial circuit of a resistor element and a condenser element or a serial circuit of a plurality of resistor elements, and a potential at a connection point of the elements is input to the controller to detect a ground fault. The Kubo ground fault detection circuit is connected between the negative line of the battery and the vehicle body. The Kubo inverter device judges that a ground fault has occurred in the negative line of the battery when the input potential has decreased, and judges that ground fault has occurred in a positive line of the battery or in an output of the inverter when the input potential has increased.

As a final example, U.S. Pat. No. 8,022,710 issued to Ivan et al. (hereinafter "Ivan") teaches methods for AC fault detection. In general, Ivan teaches a method for detecting an AC fault caused by a module coupled to a bus of a hybrid/electric power train system. When a high voltage DC input signal is received from the bus, the differential mode voltage component is removed from the high-voltage DC input signal to generate a common mode AC voltage signal. A magnitude of the common mode AC voltage signal is measured and it is determined whether the measured magnitude of the common mode AC voltage signal is greater than or equal to a fault detection threshold voltage. Thus Ivan teaches detection and removal of a differential mode voltage from a DC input signal.

SUMMARY OF THE INVENTION

Economical methods and circuits for detecting ground faults, particularly those that cause AC leakage in a vehicle electric drive system, are presented. A method for fault detection can include providing a voltage to an inverter, providing alternating current from said inverter to a machine, receiving first direction current and opposing direction current at a detection means, and using difference between said first direction current and said opposing direction current to detect a ground fault. In an example embodiment, receiving first direction current and opposing direction current can comprise receiving alternating phase currents through a core having a portion wrapped in a coil, at a coil alone, or at three separate coils. As a further example, receiving first direction current and opposing direction current can comprise receiving a positive DC bus and a negative DC bus through a core having a portion enwrapped by a coil, or simply receiving the positive and negative DC buses through the center of a coil. By way of example, using induced current to detect a ground fault can comprise comparing a parameter associated with an induced current to a predetermined threshold or using the parameter in other decision-making schemes. In a further example method using induced current to detect a ground fault can comprise using a parameter associated with a voltage at a device configured to receive the induced current.

An example circuit for detecting a ground fault can include an energy storage device (ESD) configured to provide a voltage, an inverter coupled to the ESD and configured to provide alternating current, a detection means configured to receive first direction and opposing direction current, and a fault determination module (FDM) configured to use the difference between said first direction current and said opposing direction current to detect said ground fault By way of example, a detection means can comprise an electromagnetic detection means such as one or more coils, or a core wrapped by a coil. An example ground detection circuit can comprise an ESD, an inverter coupled to the ESD and configured to provide alternating current, a detection means configured to receive first direction current and opposing direction current and provide induced current, wherein the circuit is configured to use the induced current to detect a ground fault. By way of example, a circuit can be configured to detect AC current leakage in order to detect the presence of a ground fault.

In an example method, transient current caused by AC current leakage can be used to detect the presence of the ground fault. For example, a method can include providing a voltage from an ESD to an inverter, providing alternating current from said inverter to an electrical machine, receiving transient current at a detection means disposed between said ESD and said inverter input, and using the transient current to detect a ground fault. A method can include detecting a voltage at the detection means, caused by conduction of said transient current, and using the voltage to detect the presence of a ground fault.

An example circuit for detecting a ground fault can include an ESD configured to provide a DC voltage, an inverter coupled to the ESD and configured to provide alternating current to an electrical machine, and a detection means disposed between the ESD and the inverter input. The detection means can be configured to receive transient current that can be produced by leakage of the alternating current. By way of example, the detection means can be embodied as a resistor coupled to a ground potential and a Y-capacitor circuit branch. An example circuit can further include a fault determination module configured to use a voltage at the detection means to detect a ground fault

DETAILED DESCRIPTION OF EXAMPLE EMBODIMENTS

Figure 1:
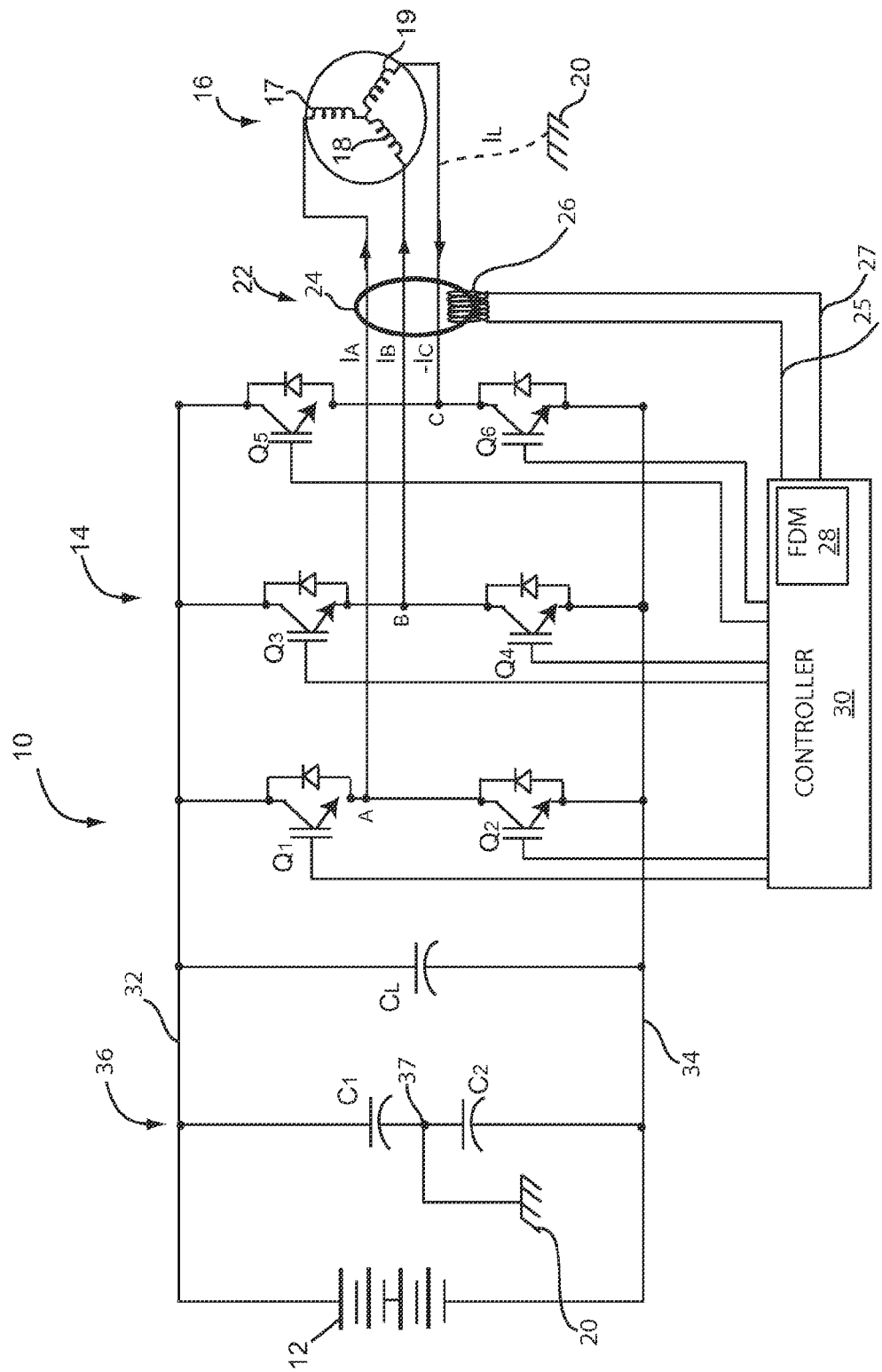
FIG. 1 shows an example circuit for detecting a ground fault.

As required, example embodiments of the present invention are disclosed. The various embodiments are meant to be non-limiting examples of various ways of implementing the invention and it will be understood that the invention may be embodied in alternative forms. The present invention will be described more fully hereinafter with reference to the accompanying drawings in which like numerals represent like elements throughout the several figures, and in which example embodiments are shown. The figures are not necessarily to scale and some features may be exaggerated or minimized to show details of particular elements, while related elements may have been eliminated to prevent obscuring novel aspects. The specific structural and functional details disclosed herein should not be interpreted as limiting, but merely as a basis for the claims and as a representative basis for teaching one skilled in the art to variously employ the present invention. For example, while the exemplary embodiments are discussed in the context of a vehicle, it will be understood that the present invention is not limited to that particular arrangement. In addition, actions described as part of a method or process, may be described in a particular sequence for the sake of teaching the practice of the invention. However, such description should not be interpreted as limiting the invention to a particular example sequence, as actions may be performed concurrently or in alternate sequences.

As shown by the several examples provided herein, the invention can be practiced by a variety of methods and circuits. In an example embodiment, alternating current leakage is detected in order to detect a ground fault. Leakage of alternating current at an output or AC side of an inverter can generate a transient current at an input side of an inverter via a common ground potential. Accordingly, a fault detection circuit can include a detection means that can be disposed at the input side of an inverter or at the output side of an inverter. In an example embodiment, a fault detection circuit can include a detection means in the form of an electromagnetic device configured to provide an induced current. Detecting an induced current, parameterizing, filtering, and/or processing of the same, as well as employing decision-making algorithms using the parameter can all contribute to the determination that a ground fault is present. By way of example, a fault detection circuit can include a detection means configured to receive transient current. An example circuit can include a detection means configured to receive transient current on an input side of an inverter that results from leakage of alternating current on the output side of the inverter. A parameter associated with either induced current or transient current can be used to determine whether a ground fault exists. A fault detection circuit can be configured to detect ground faults on the DC side of an inverter as well as on the AC side of an inverter.

Turning now to the several Drawings in which like reference numerals refer to like elements throughout the several views, FIG. 1 shows an example circuit 10 for detecting the presence of a ground fault. By way of example, but not limitation, the circuit 10 can be used in an electric drive system for an electric or hybrid electric vehicle. Example circuit 10 can include a DC energy storage device (ESD) 12 coupled to an inverter 14 that is configured to provide alternating current to an electric machine 16. AC current leakage is represented by leakage current $I_L$, an undesired current path to a reference or ground potential 20. In an example embodiment, the ground potential 20 can be embodied as a vehicle chassis. A detection means 22 can be configured to detect the presence of the leakage current $I_L$. By way of example, the detection means 22 can be embodied as an electromagnetic device configured to provide an induced current. The detection means 22 can be coupled to a fault determination module (FDM) 28. By way of example, the FDM 28 can be configured to cooperate with a controller 30 for the inverter 14.

In an example embodiment, the ESD 12 can comprise a high voltage device configured to provide a DC voltage of around 300V to the inverter 14. The ESD 12 can be embodied as a battery or bank of batteries, a capacitor bank, or as any other device configured to store energy and provide a voltage sufficiently high for driving the electric machine 16. By way of example, but not limitation, the ESD 12 can be in the form of a lithium-ion traction battery configured to provide a voltage of 300V or more to drive an electric motor for an automobile. The ESD 12 can be coupled to the inverter 14 by a DC positive bus 32 and a DC negative bus 34.

In an example circuit, the inverter 14 can comprise a plurality of switching elements Q1-Q6 that can be individually controlled by the controller 30 to provide a three-phase alternating current to the machine 16. By way of example, the switching elements Q1-Q6, can comprise power electronic devices such as metal-oxide-semiconductor field-effect transistors (MOSFETs) or insulated-gate bipolar transistors (IGBTs) configured and controlled to produce phase currents $I_A$, $I_B$ and $I_C$ which can flow between the inverter 14 and the electric machine 16.

In an example circuit, the electric machine 16 can be embodied as a permanent magnet synchronous motor (PMSM) configured to drive a load. For example a PMSM can be configured to drive a vehicle wheel axis through a power transfer unit and differential (not shown) at the vehicle. It is contemplated that the electric machine 16 can function as a motor, converting electrical energy to kinetic energy, or as a generator, converting kinetic energy to electric energy. The electric machine 16 can include a first winding 17 configured to receive the phase current $I_A$, a second winding 18 configured to receive the phase current $I_B$, and a third winding 19 configured to receive the phase current $I_C$. A three-phase cable (not shown), or three separate cables can be configured to protect, secure, and isolate the phase currents between the inverter 14 and the electric machine 16. Despite best efforts to the contrary, leakage of the AC currents $I_A$-$I_C$ may occur, for example a short or low impedance circuit may occur between a phase current conductor and a vehicle chassis. While depicted in FIG. 1 as leakage of the $I_C$ current, it is understood that the present invention is directed to leakage of any of the phase currents $I_A$-$I_C$. Since a vehicle chassis can provide a common ground potential for other vehicle modules, an undesired current path to the chassis can adversely affect operation of one or more vehicle components. Low-voltage modules can be particularly vulnerable to the ill effects of ac ground faults.

The detection means 22 can be embodied as an electromagnetic device configured to receive the phase currents $I_A$-$I_C$. Under normal operation, the currents $I_A$-$I_C$ have magnitudes and phases that enable them to cancel each other out, meaning that the current flowing from the inverter 14 to the machine 16, phase currents $I_A$ and $I_B$, is equal to the current flowing from the machine 16 to the inverter 14, shown here as $-I_C$, so that the net current flow sums to zero. However, when there is leakage of the AC current, current flow in one direction will be less than current flow in the opposing direction. For example, assume at a given time t the direction of the phase currents $I_A$-$I_C$ is given by the arrows with which they are associated in FIG. 1. If leakage of the $I_C$ phase current occurs, there will be less current flowing towards the inverter 14 than towards the machine 16. In the example of FIG. 1, the detection means 22 comprises an electromagnetic device, embodied here as a magnetic core 24 having a secondary winding or coil 26. By way of example, the core 24 can comprise ferromagnetic or ferromagnetic materials and can be variously shaped. For example, the core 24 can be in the form of a cylindrical rod, or in the form of an "I", "C", "U", or "E" core, a pot core, a toroidal core, a ring core, or a planar core, as known in the art. Accordingly, the aperture by which the currents I1-I3 are received by the core 24 can vary in size and shape. In addition, the core 24 can have various compositions, such as, but not limited to, iron, iron alloy, soft iron, silicon steel, carbonyl iron, and ferrite ceramic materials. Net current through the core 24 will cause an induced current in the coil 26. A first lead 25 and a second lead 27 can extend from the coil 26 to provide any induced current to the FDM 28.

The FDM 28 can include hardware, software, firmware or some combination thereof, including analog and/or digital circuitry. By way of example, the FDM 28 can include one or more filters, amplifiers, comparators, sensors, and/or other circuit elements and logic to provide a parameter associated with an induced current, and/or to determine whether a ground fault is present. For example, a parameter can be directly related to an induced current that represents a difference between opposing currents, or can be related to a voltage provided by a device, such as a resistor, that receives the induced current. By way of example, but not limitation, the FDM 28 can be configured to compare a parameter associated with an induced current to a predetermined value or range of values and provide a fault signal when a parameter exceeds a threshold or otherwise fails to fall within an acceptable range. For example, the FDM 28 can be configured to compare the magnitude of the induced current provided by the coil 26 to a predetermined threshold. In an example embodiment, the FDM 28 can include a special purpose microprocessor configured to execute filtering, averaging, decision making, and other fault determination functions using one or more parameters associated with an induced current, or with a voltage based on an induced current, to detect a ground fault and provide a fault signal.

As shown in FIG. 1, in an example embodiment, the FDM 28 can operate as a module executed at or configured to otherwise cooperate with a controller 30 configured to provide drive signals for the switches Q1-Q6. By way of example, the controller 30 can comprise hardware, software, firmware or some combination thereof, and can be configured to use pulse width modulation to alternately turn the switching devices Q1-Q6 on and off to provide the phase currents $I_A$-$I_C$. By way of example, the controller 30 can comprise a microcontroller configured to cooperate with the FDM 28. In an example embodiment, the controller 30 can be configured to provide a fault signal in response to a determination by the FDM 28 that a ground fault is present. The invention can be practiced in a system in which the controller 30 can be configured to shutdown operation of the inverter 14 in response to a ground fault detection.

Referring again to FIG. 1, the example circuit 10 can further include a DC link capacitor $C_L$ at the input to the inverter 14 between the positive and negative DC buses 32, 34. The DC link capacitor $C_L$ can be embodied as an electrolytic capacitor, a film capacitor, or other type of capacitor. The functions that the DC link capacitor $C_L$ can be configured to perform can include decoupling of the effects of inductance from the ESD 12 to the inverter 14, as well as providing a low impedance path for ripple currents associated with a hard-switched inverter 14. By absorbing a high ripple current generated by the inverter 14, the capacitor $C_L$ can suppress rapid variation of voltage/current at a DC input terminal of the inverter, providing a smoothing function that can improve inverter 14 operation and protect the ESD 12.

An example circuit can further include a Y-capacitor circuit branch 36 comprising a first capacitor $C_1$ and a second capacitor $C_2$. The Y-capacitor circuit branch 36 can be configured to suppress the switching noise of the inverter 14. Switching elements of the inverter 14 can be turned on and off at a high switching rate. Unfortunately, the high switching frequency can have a significant effect on the electromagnetic wave performance of the inverter 14 and the vehicle in which it is employed. Switching noise generated at the inverter can be transmitted to a vehicle chassis via a mounting bracket of the inverter, and can also be transmitted by the vehicle motor. The Y-capacitor branch 36 can be coupled to the ground potential 20, for example a vehicle chassis, via the node 37, enabling the capacitors $C_1$ and $C_2$ to provide some degree of noise suppression.

Figure 2:
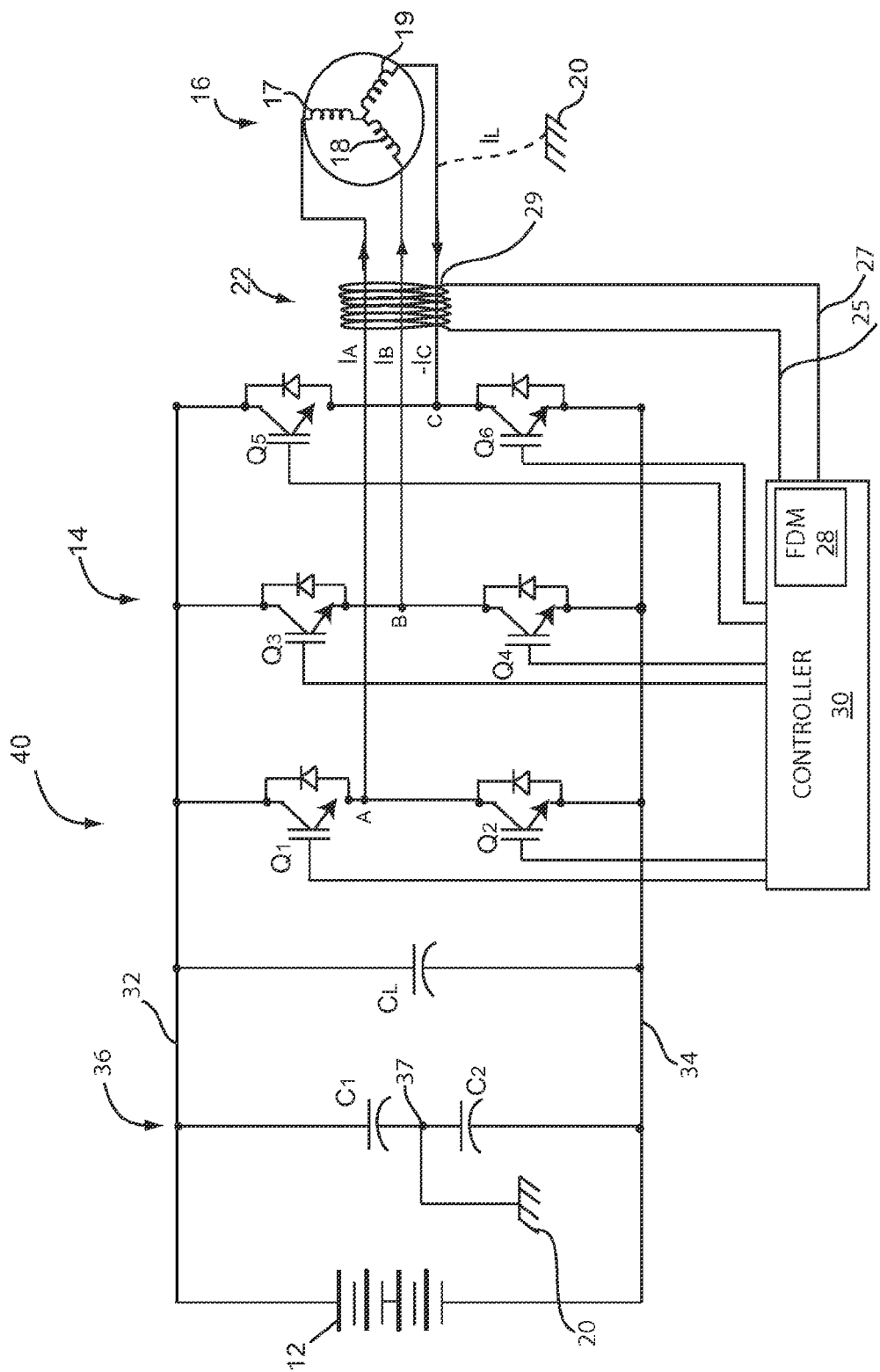
FIG. 2 shows an example circuit for detecting a ground fault.

FIG. 2 shows an example fault detection circuit 40 in which the detection means 22 is again embodied as an electromagnetic device, this time as simply a coil 29, configured to receive the phase currents $I_A$-$I_C$ through the air space within it. Again, any imbalance of the phase currents $I_A$-$I_C$ will result in a net current through the interior air space of the coil 29, which will cause an induced current in the coil 29. The FDM 28 can be configured to use a parameter associated with the induced current, such as current magnitude, to determine whether a ground fault exists. For example, the FDM 28 can compare the parameter to a predetermined value or range of values. In an example embodiment, the FDM 28 can be configured to execute one or more decision-making algorithms using a parameter associated with an induced current.

Figure 3:
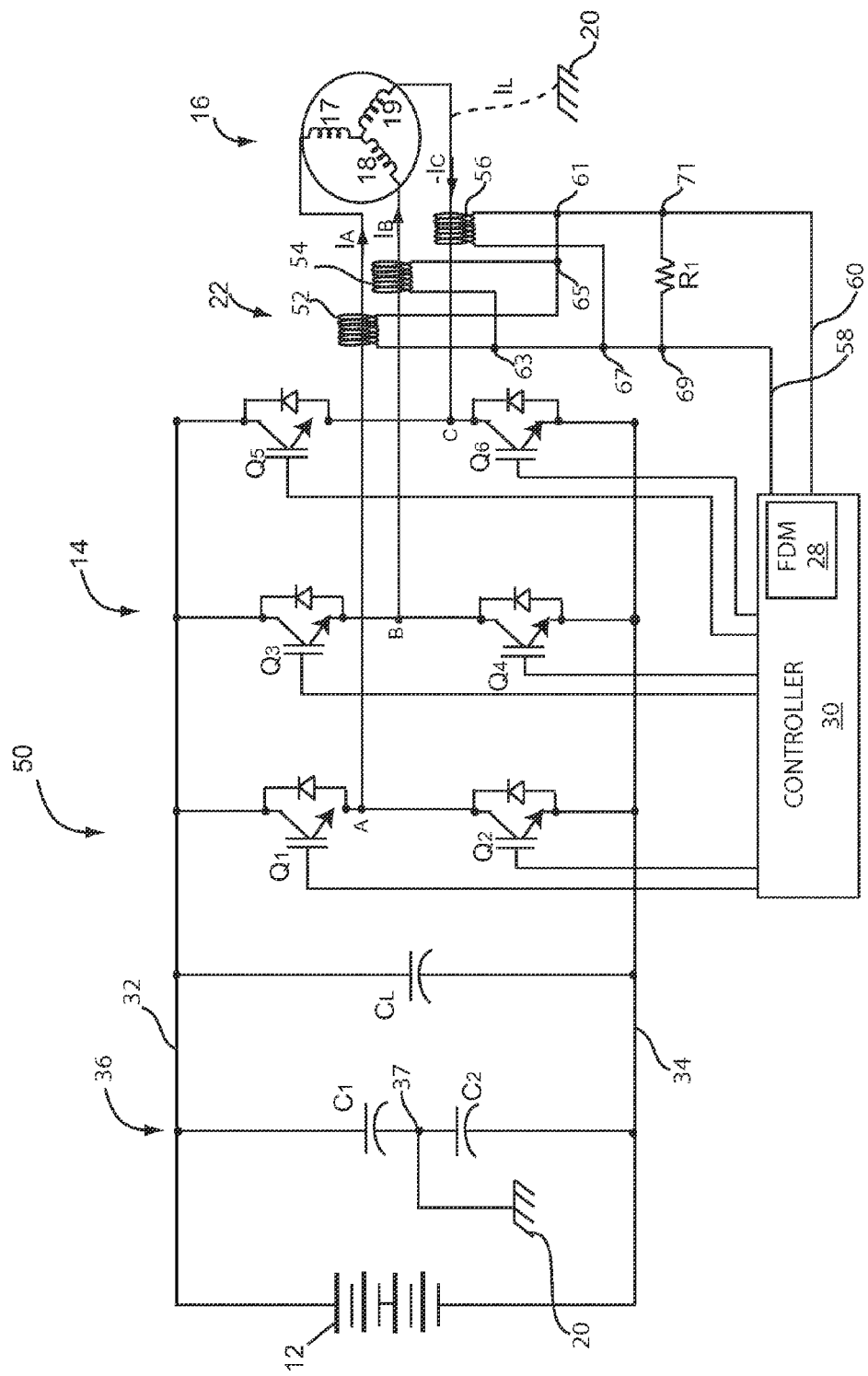
FIG. 3 shows an example circuit for detecting a ground fault.

FIG. 3 shows an example fault detection circuit 50. The detection means 22 is again embodied as an electromagnetic one, in this case as a set of three coils, one for each of the phase currents $I_A$-$I_C$. For example, a coil 52 can be configured to receive a conductor associated with phase current $I_A$ through the air space within its winding, a coil 54 can be configured to receive passage of the conductor associated with phase current $I_B$, and the coil 56 can be configured to receive a conductor associated with the phase current $I_C$ through its inner air space. Because current flowing in a conductor surrounded by coil will generate a magnetic field that can induce a current inside the coil itself, each of the coils 52-56 will have an induced coil current. Just as the phase currents $I_A$-$I_C$ should sum to around zero under normal, no leakage operation, so should the coil currents that are induced in response to them. As shown in FIG. 3, the coils 52, 54, 56 can be coupled to a first lead 58, extending from the coil 52, and to a second lead 60 extending from the coil 56. For example, the coil 52 can be coupled to the lead 60 at the node 61. Coil 54 can be coupled to the lead 58 at the node 63 and to the lead 60 by the nodes 65 and 61. Finally, the coil 56 can be coupled to the lead 58 at the node 67. A resistor $R_1$ can be coupled to the first lead 58 at the node 69 and to the second lead 60 at the node 71. A voltage over the resistor $R_1$ can be indicative of an induced current resulting from a difference between current flowing towards the inverter 14 ($-I_C$) and current flowing away from the inverter 14 ($I_A$ and $I_B$). In an example embodiment, the resistor $R_1$ can have a resistance of around several thousand ohms. In an example circuit, the leads 58 and 60 can be provided to the FDM 28, which can be configured to detect the voltage between the nodes 69 and 71 and compare it to a predetermined threshold. Thus, a parameter associated with an induced current can be in the form of a voltage at a device configured to receive the induced current.

Figure 4:
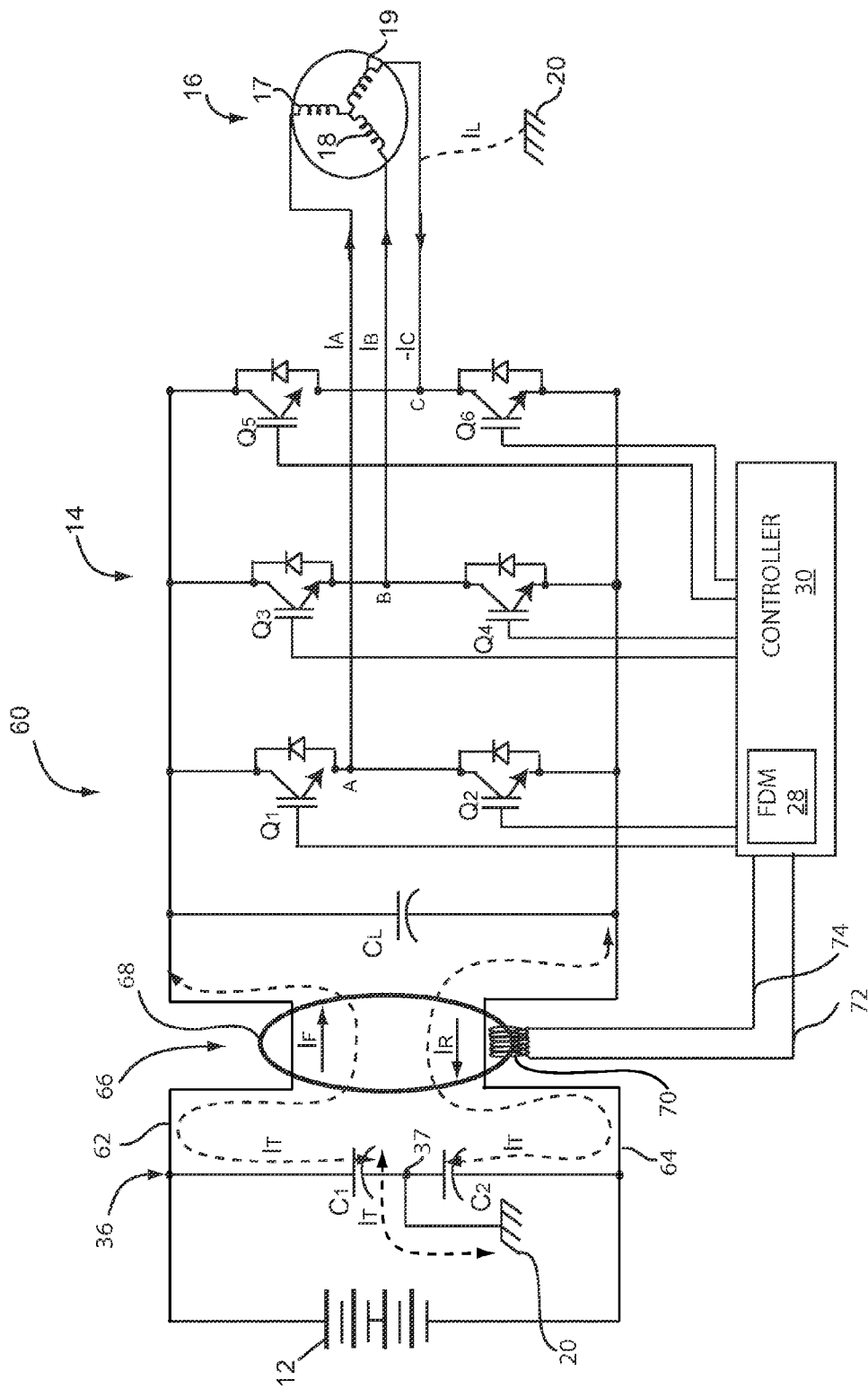
FIG. 4 shows an example circuit for detecting a ground fault.

FIG. 4 shows an example fault detection circuit 60. Leakage current $I_L$ on the AC side of the inverter 14 can cause a transient current $I_T$ on the DC side of the inverter 14 through a common ground potential 20, such as a vehicle chassis. For example, the leakage current $I_L$ can be a short circuit between a phase current and the vehicle chassis, and the ground node 37 can provide a connection between the chassis and the Y-capacitor branch 36. The first capacitor $C_1$ can couple a positive DC bus 62 with the ground node 37, and the second capacitor $C_2$ can couple a negative DC bus 64 with the ground node 37, enabling an alternating $I_T$ to flow to the positive and negative buses 62, 64. The fault detection circuit 60 can include a detection means 66 disposed at the DC side of the inverter 14, configured to detect the presence of the transient current $I_T$. In an example embodiment, the detection means 66 can comprise an electromagnetic device, embodied here as a core 68 having a secondary winding 70. As discussed previously herein, the core 68 can be variously shaped, and may be composed of a variety of materials. The core 68 can be configured to receive the positive and negative DC buses 62, 64. Under normal operating conditions, with no leakage, the current flow in a first direction ($I_F$) in the DC positive bus 62 will be the same as the current flow in the opposite or reverse direction ($I_R$) in the DC negative bus 64, so the net current through the core 68 will be zero. However, the AC $I_T$ generated by the AC $I_L$ causes an imbalance, so that one of $I_F$ and $I_R$ will be greater than the other. The presence of a net current through the core 68 will generate a magnetic field that can induce a coil current in the secondary winding 70. Leads 72 and 74 coupled to the secondary winding 70 can provide the coil current to the FDM 28, which, as described above, can be configured to use an induced current parameter to detect a ground fault. By way of example, but not limitation, the FDM 28 can be configured to compare an induced current parameter, such as current magnitude, to a predetermined threshold to determine the presence of a ground fault.

Figure 5:
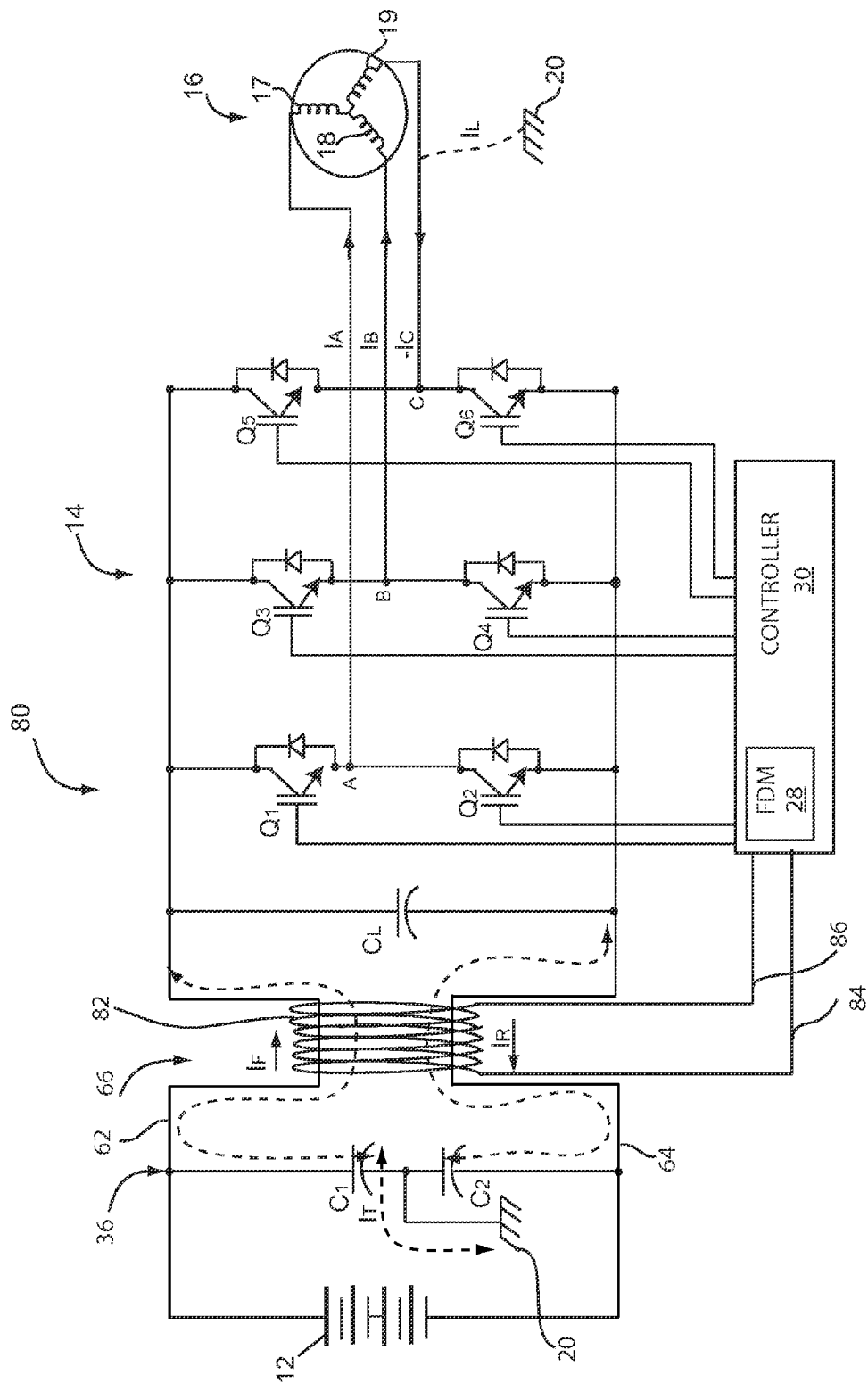
FIG. 5 shows an example circuit for detecting a ground fault.

FIG. 5 shows an example ground fault detection circuit 80. The circuit 80 can detect ac leakage current, i.e. current leakage on the ac side of an inverter. In this example, the detection means 66 is an electromagnetic device in the form of a coil 82 configured to receive the positive DC bus 62 and the negative DC bus 64 through the space within its winding. When the transient current $I_T$ is present due to $I_L$, a net current passing through the air space of coil 82 can induce a coil current within the coil 82. Leads 84 and 86 can provide the induced coil current to the FDM 28, which can be configured to use a coil (induced) current parameter to detect the presence of a ground fault. For example, the FDM 28 can be configured to compare a parameter to a predetermined threshold or range of values. When the parameter exceeds the threshold, a fault signal can be provided, for example, to the controller 30. In an example embodiment, a fault signal generated in response to ground fault detection can trigger a shut down of the inverter 14 operation.

Figure 6:
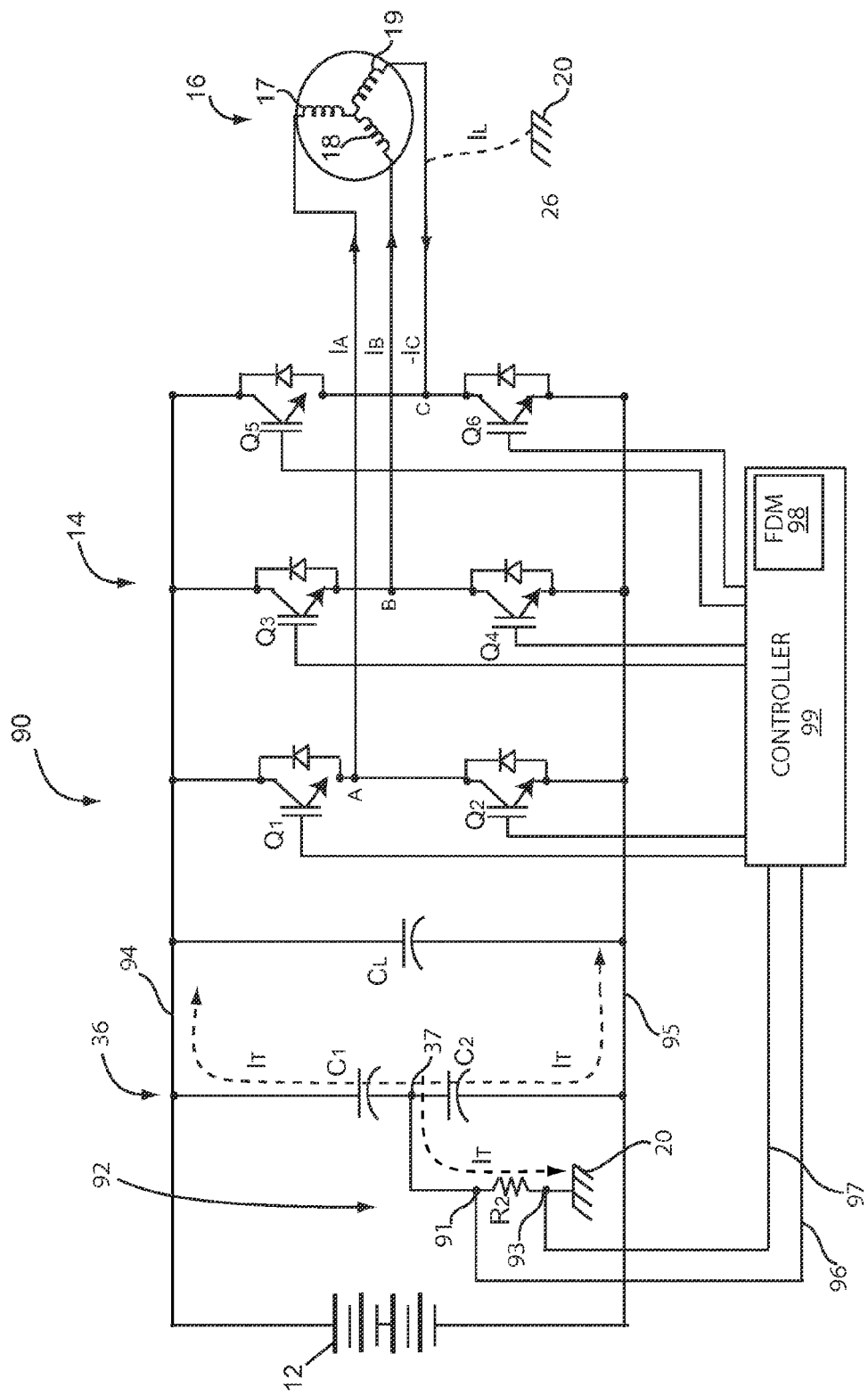
FIG. 6 shows an example circuit for detecting a ground fault.

FIG. 6 shows an example ground fault detection circuit 90 in which the leakage current $I_L$ causes a transient current $I_T$. The circuit 90 includes a detection means 92 in the form of a resistor $R_2$ coupled to the ground 20, for example to a vehicle chassis, and to a Y-capacitor branch 36 at a node 37. $I_T$ can flow through the resistor $R_2$, and through the Y-capacitor branch 36 to a positive DC bus 94 and a negative DC bus 95. Leads 96 and 97, coupled to opposing terminals of the resistor R at the nodes 91 and 93, can be coupled to an FDM 98 at a controller 99 configured to control the inverter 14. The FDM 98 can be configured to compare a voltage across $R_2$ to a predetermined threshold to determine whether ac current leakage indicative of a ground fault is present. A fault signal can be provided when an $R_2$ voltage exceeds the predetermined threshold.

Figure 7:
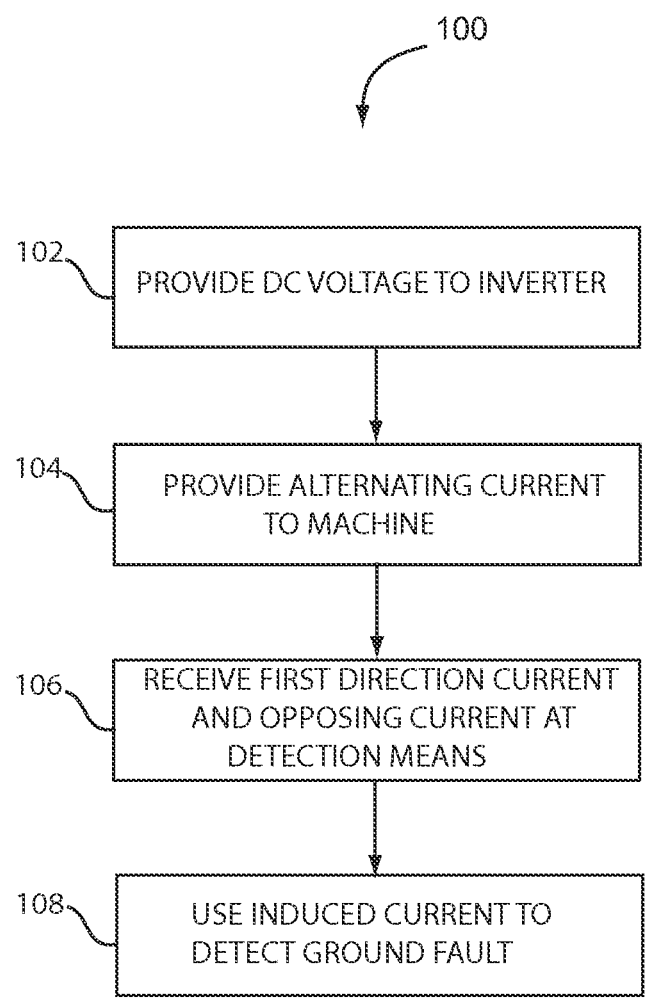
FIG. 7 shows an example method for detecting a ground fault.

FIG. 7 shows an example method 100 for ground fault detection. At block 102 a direct current voltage can be provided to an inverter. For example, the ESD 12 can provide a DC voltage to the inverter 14 via the positive DC bus 32 and the negative DC bus 34. At block 104, an alternating current can be provided from the inverter to a machine. For example, the inverter 14, coupled to the electrical machine 16, can be configured to provide the three phase currents $I_A$-$I_C$, which can alternately flow towards or away from the machine 16. At block 106 an electromagnetic detection means can receive first direction current and opposing direction current. For example, the core 24 can receive the phase currents $I_A$-$I_C$. At block 108, induced current can be used to detect a ground fault. As discussed previously herein, the presence of an induced current indicates the current flowing towards the machine 16 does not equal the current flowing back towards the inverter 14, a condition that can indicate a ground fault. For example, via the leads 25 and 27, an induced current in the coil 26 can be provided to the FDM 28, which can be configured to use an induced current parameter to detect a ground fault. For example, the FDM 28 can compare induced current amplitude to a predetermined threshold, and if the threshold is exceeded, a determination can be made that a ground fault is present.

Figure 8:
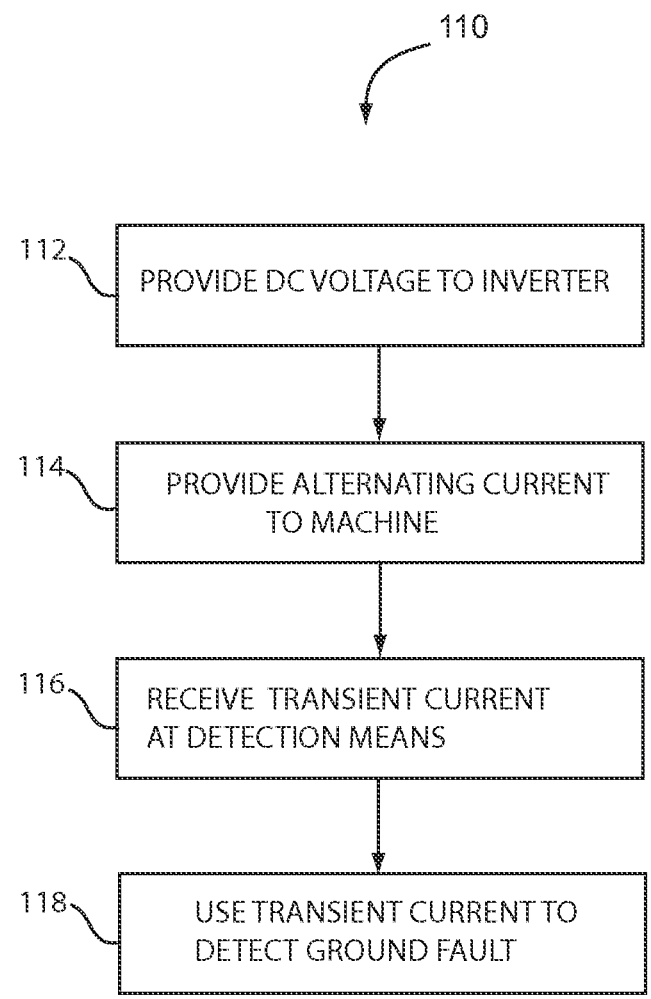
FIG. 8 shows an example method for detecting a ground fault.

FIG. 8 shows a flow diagram for an example method 110 for detecting the presence of a ground fault. At block 112 a direct current voltage can be provided to an inverter. For example, a voltage from the ESD 12 can be provided to the inverter 14 via the DC positive bus 94 and the DC negative bus 95. At block 114, alternating current can be provided to an electrical machine. For example, the inverter 14 can provide alternating phase currents $I_A$-$I_C$ to the electrical machine 16. At block 116, transient current can be received at a detection means. For example, the transient current $I_T$ can flow through the resistor $R_2$. At block 118, transient current can be used to detect a ground fault. For example, a voltage detection means at the FDM 98 can sense the voltage over the resistor $R_2$ and compare the sensed voltage to a predetermined threshold.

Thus the present invention provides methods and apparatus for detecting a ground fault. The invention can be practiced in various ways, such as using transient current or induced current to determine the presence of a ground fault. For example, an electromagnetic detection means can be used to provide an induced current when ac leakage caused by a ground fault results in an imbalance in feed current and back current. A parameter associated with the induced current can be used by an FDM to detect the presence of a ground fault. Alternatively, a voltage at a device configured to receive the induced current can be used. By way of example, but not limitation, current and/or voltage can be filtered, amplified, or otherwise processed, and various decision-making algorithms can be implemented at an FDM. For example, a parameter can be compared to a predetermined threshold. By way of further example, a parameter associated with a at a device configured to receive a transient current can be used to detect a ground fault. A detection means can be disposed at the AC side of a circuit, or at the DC side of a circuit, and ground faults on either side of an inverter can be detected. The invention provides a safe, reliable and economic means for ground fault detection.

As required, illustrative embodiments have been disclosed herein, however the invention is not limited to the described embodiments. As will be appreciated by those skilled in the art, aspects of the invention can be variously embodied, for example, modules and programs described herein can be combined, rearranged and variously configured. Methods are not limited to the particular sequence described herein and may add, delete or combine various steps or operations. The invention encompasses all systems, apparatus and methods within the scope of the appended claims.

What is claimed:

1. A ground fault detection circuit, comprising:
a high voltage (HV) energy storage device (ESD), that is coupled to and provides a DC voltage to a high voltage DC link comprising a positive dc bus and a negative DC bus; an inverter, coupled to said ESD by said DC link, that provides alternating current output to an electric motor; a detection means disposed between said inverter and said electric motor, through which a first conductor conducting a first phase current between a first node at a first phase leg of said inverter and a first winding of said motor passes, a second conductor conducting a second phase current between a second node at a second phase leg of said inverter and a second winding of said motor passes, and a third conductor conducting a third phase current flowing between a third node at a third phase leg of said inverter and a third winding of said motor passes, said detection means receiving first direction current and opposing direction current flowing between said inverter and said electric machine; and providing an induced current;
a fault determination module (FDM) that receives said induced current and detects said ground fault from said induced current.

2. The circuit of claim 1, wherein said detection means comprises a coil encircling a space through which said first, second and third conductors pass.

3. The circuit of claim 1, wherein said detection means comprises a first coil encircling a first space through which said first conductor conducting said first phase current passes, a second coil encircling a second space through which a second conductor conducting said second phase current passes, and a third coil encircling a third space through which said third conductor conducting said third phase current passes, said first, second and third coils coupled to one another and configured to conduct said induced current.

4. The circuit of claim 1, wherein said detection means comprises a core through which said first conductor, said second conductor and said third conductor pass, said core having a portion wrapped by a coil configured to conduct said induced current.

5. The circuit of claim 1, wherein said ESD comprises a traction battery for an electrified vehicle and said ground fault detection circuit is disposed at said electrified vehicle.

6. The circuit of claim 1, wherein said FDM is coupled to a controller for said inverter.

7. A ground fault detection circuit, comprising:
an energy storage device (ESD) that provides a voltage to a high voltage dc bus link comprising a positive dc bus and a negative dc bus; an inverter, coupled to said ESD by said high voltage dc bus link, providing alternating current output to an electric motor; a Y-capacitor branch coupled to said positive and negative dc buses, disposed between said ESD and said inverter, said Y-capacitor branch comprising a first capacitor and a second capacitor; a resistor directly coupled to a first node disposed between said first and second capacitors at said Y-capacitor branch and coupled to a chassis, receiving a transient current resulting from a ground fault and providing a voltage based on said transient current; and a fault detection module (FDM) coupled to said resistor and that uses a voltage at across said resistor to detect said ground fault.

8. The circuit of claim 7, wherein said FDM is coupled to a controller for said inverter.

\* \* \* \* \*